United States Patent
Lee et al.

[11] Patent Number: 5,852,305
[45] Date of Patent: Dec. 22, 1998

[54] LIQUID CRYSTAL DISPLAY APPARATUS WITH REPAIR STRUCTURE

[75] Inventors: Seong Su Lee, Kyungki-do; Woo Nam Jeong, Seoul, both of Rep. of Korea

[73] Assignee: LG Electronics Inc., Seoul, Rep. of Korea

[21] Appl. No.: 825,180

[22] Filed: Mar. 27, 1997

[51] Int. Cl.[6] .................................................. H01L 27/01
[52] U.S. Cl. .............................. 257/59; 257/72; 349/54; 349/149; 349/152
[58] Field of Search ..................... 257/59, 72; 349/149, 349/54, 152

[56] References Cited

U.S. PATENT DOCUMENTS 5,473,452  12/1995  Shin ........................................... 349/54

FOREIGN PATENT DOCUMENTS 405341312  12/1993  Japan ........................................ 349/54

Primary Examiner—Tom Thomas
Assistant Examiner—Fetsum Abraham
Attorney, Agent, or Firm—Finnegan, Henderson, Farabow, Garrett & Dunner, L.L.P.

[57] ABSTRACT

A liquid crystal display having a TFT cell array including a plurality of gate lines formed in parallel on a substrate and a plurality of data lines formed perpendicularly to the gate lines. The plurality of gate lines have gate pads at one end, while the plurality of data lines have data pads at either one or both ends. A repair line, which is formed on the periphery of the substrate, intersects the plurality of data lines at both ends, but intersects the plurality of gate lines at only one end.

3 Claims, 2 Drawing Sheets

LIQUID CRYSTAL DISPLAY APPARATUS WITH REPAIR STRUCTURE

BACKGROUND OF THE INVENTION

1. Field of the Invention

The present invention relates to a liquid crystal display (LCD). In particular, it relates to a LCD structure wherein gate and repair lines intersect only on one side of the gate line.

2. Description of the Related Art

Generally, a thin film transistor-liquid crystal display (TFT-LCD) has both a bottom and top glass plate. The TFT-LCD design typically arranges TFTs and pixel electrodes on the bottom glass plate. The top glass plate contains a common electrode and a color filter layer for displaying colors. Liquid crystal material fills the gap between the bottom and top glass plates. Additionally, polarizing layers, attached to the surfaces of both the bottom and top glass plates, polarize visible light rays.

LCDs with a TFT cell array formed on the bottom plate form poor panels if a defect opens or shorts any one of gate lines or data lines. Accordingly, to repair such a panel, a repair line is provided in the LCDs. The repair line is formed at the periphery of the TFT cell array region and connects to the shorted or opened data line or gate line allowing the TFT cell array to operate normally. When a defect is detected in or near one of the cells of the TFT-LCD cell array, the repair line replaces the defective gate or data line to repair the TFT-LCD. A conventional LCD repair technique is explained below with reference to the figures.

FIG. 1 shows a layout of a conventional LCD. FIG. 2 shows a cross-sectional view of portion I of FIG. 1. Referring to FIGS. 1 and 2, a substrate 11 contains a plurality of gate lines 1 arranged in parallel at a predetermined distance from one another. Gate lines 1 transmit drive signals to a plurality of pixels (not shown). Substrate 11 also contains a plurality of data lines 2 arranged in parallel at a predetermined distance from one another. Data lines 2 are perpendicular to the plurality of gate lines 1 and supply data signals to the plurality of pixels. A plurality of gate pads 1a and a plurality of data pads 2a are formed on adjacent sides of the TFT cell array and each connecting to a plurality of gate lines 1 and data lines 2, respectively. A repair line 4 intersects the plurality of gate lines 1 and data lines 2.

To determine whether the bottom glass plate of the LCD structure is defective, a drive signal and a data signal are supplied to gate pad 1a and data pad 2a, respectively. For example, if a data line is open at point 3, then a repair portion 5 of repair line 4 connects data line 2 and repair line 4. A laser (not shown) connects data line 2 and repair line 4, through insulating layer 12, where they intersect. Therefore, the TFT cell array can be driven even though it is connected to an opened data line.

FIG. 2 shows a cross-sectional view of portion I of FIG. 1. Conventional LCD structure for line repair includes a plurality of gate lines 1 formed in parallel at a predetermined distance from one another on a substrate 11. An insulating layer 12 covers the surface of substrate 11 and the plurality of gate lines 1. Repair line 4 is provided and formed on insulating layer 12, and is covered by a passivation insulating layer 13.

The conventional LCD structure, however, has the following disadvantage. When one of the plurality of data lines 2 is opened and repair line 4 is used to transmit data signals, insulating layer 12 causes capacitance to formed between repair line 4 and one of the plurality of gate lines 1. The capacitance increases signal delay because signal delay is proportional to the product of capacitance and resistance, that is, T=R*C, wherein T is signal delay constant, C is capacitance, and R is resistance.

In light of the foregoing, there is a need for a line repair structure in an LCD that would reduce the time delay disadvantage of the conventional structure.

SUMMARY OF THE INVENTION

Accordingly, the present invention is directed to a liquid crystal display that substantially obviates one or more of the problems due to limitations and disadvantages of the related art.

The present invention provides a liquid crystal display structure with a repair line formed on only one side of an associated gate line. Accordingly, signal delay is reduced because no capacitance is formed between the repair line and one of the plurality of gate lines.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes a liquid crystal display having a TFT cell array. The TFT cell array contains a plurality of gate lines, having gate pads at one end, formed in parallel and at a predetermined distance from one another on a substrate. Additionally, perpendicular to the plurality of gate lines, a plurality of data lines are formed on the substrate at a predetermined distance from one another. The data lines have data pads at either one or both ends. A repair line, being closed or opened, intersects the data lines at both ends, but intersects the gate lines at only one end. Preferably, the repair line intersects the gate lines at an end closer to the respective gate pads.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
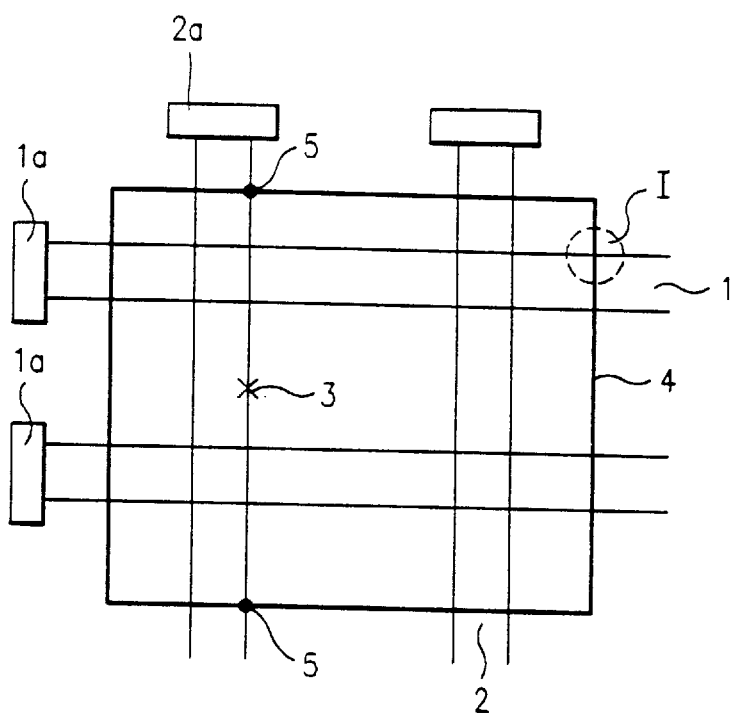
FIG. 1 is a schematic of a conventional LCD.
Figure 2:
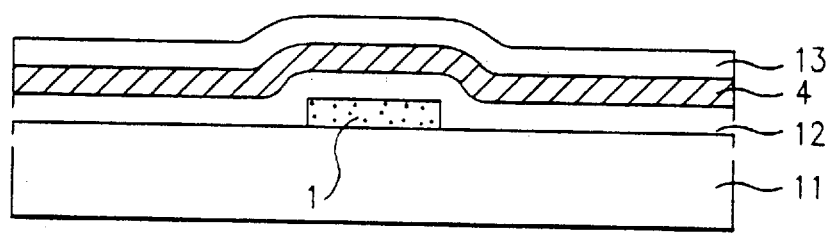
FIG. 2 is a cross-sectional view showing portion I of FIG. 1.
Figure 3A:
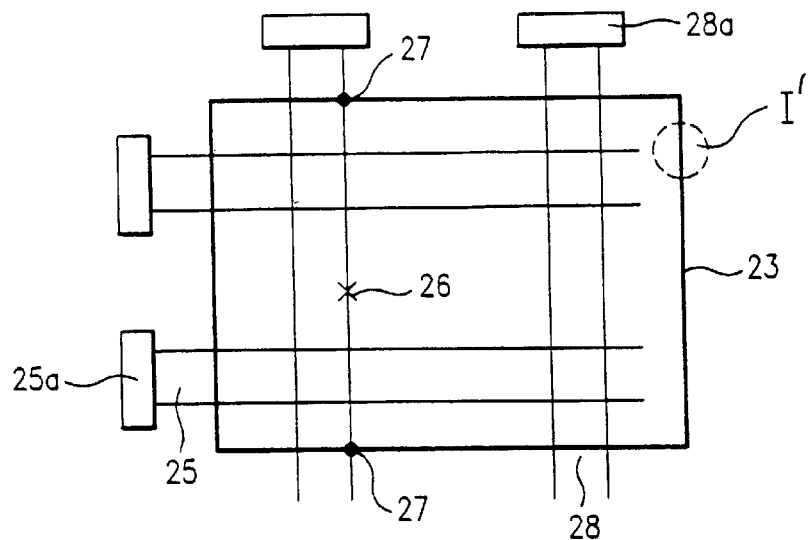
FIGS. 3a and 3b are layouts of an LCD according to the present invention.
Figure 3B:
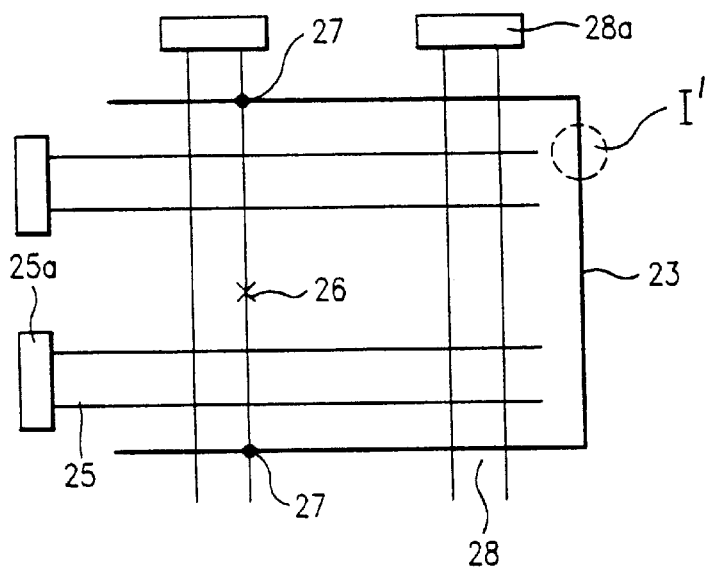

In accordance with the present invention, FIG. 3a shows a layout of an LCD having a repair line closed and FIG. 3b shows a layout of a LCD having an open repair line.

Referring to FIGS. 3a and 3b, a plurality of parallel gate lines 25 are arranged at a predetermined distance from one another. The plurality of gate lines 25 supply drive signals to a plurality of pixels (not shown). In addition, a plurality of data lines 28 are arranged at a predetermined distance from one another and are perpendicular to the plurality of gate lines 25. The plurality of data lines 28 supply data signals to the plurality of pixels. A plurality of gate pads 25a and data pads 28a are coupled to one side of the plurality of gate lines 25 and the plurality of data lines 28, respectively. As shown in FIG. 3a, a repair line 23 intersects both ends of the plurality of data lines 28, but intersects the plurality of gate lines 25 at only one end, preferably the end closer to the plurality of gate pads 25a. In FIG. 3b, the segment of repair line 23 overlying gate lines 25 adjacent gate pads 25a is omitted.

Figure 4:
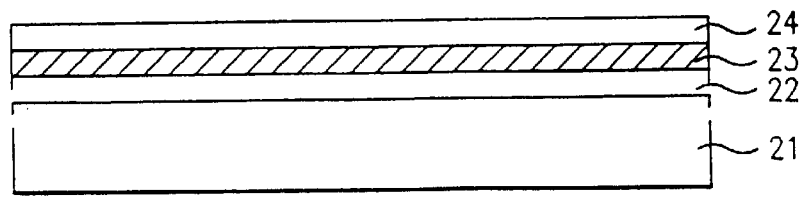
FIG. 4 is a cross-sectional view showing portion I' of FIGS. 3A a and 3b.

FIG. 4 shows a cross-sectional view of portion I' of FIGS. 3a and 3b. Referring to FIG. 4, LCD repair structure of the present invention includes a substrate 21 and a first insulating layer 22 formed on the overall surface of substrate 21. In addition, repair line 23 is formed on the first insulating layer 22, and a second passivation insulating layer 24 covers repair line 23.

To test whether the bottom glass plate of the LCD structure is operating properly, a drive signal and a data signal are supplied to gate pad 25a and data pad 28a, respectively. If data line 28 is opened at, for example, point 26, then repair portion 27 connects data line 28 and repair line 23 through the application of a laser (not shown) which breaks down insulating layer 22 at the portion where data line 28 and repair line 23 intersect. The repair line allows the TFT cell array, which has failed due to the opened data line, to operate.

According to one aspect of the present invention, repair line 23 is formed on only one side of each of the plurality of gate lines 25. Further, in accordance with another aspect, the repair line does not overlay any gate lines. Accordingly, repair line/gate line overlap is reduced, and unwanted capacitance in the LCD is minimized such that signal delay is also reduced.

It will be apparent to those skilled in the art that various modifications and variations can be made in the disclosed process and product without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A liquid crystal display comprising:

a substrate a plurality of parallel gate lines, each having first and second ends;

a plurality of data lines intersecting said gate lines, each of said data lines having first and second ends;

a gate pad coupled to one of said first ends of one of said plurality of gate lines;

a data pad coupled to one of said first ends of one of said plurality of data lines; and a repair line formed on the periphery of said substrate, said repair line intersecting said first and second ends of said plurality of data lines, and said repair line intersecting only one of said first and second ends of each of said plurality of gate lines.

2. The liquid crystal display as recited in claim 1 wherein said repair line intersects said plurality of gate lines on a side located closer to said gate pad.

3. The liquid crystal display as recited in claim 1 wherein said plurality of data lines are perpendicular to said plurality of gate lines.

* * * * *